(12) United States Patent
Quenzer-Hohmuth et al.

(10) Patent No.: US 11,784,656 B2
(45) Date of Patent: Oct. 10, 2023

(54) CONTROL DEVICE, SWITCHING CONVERTER AND METHOD FOR CONTROLLING AN OUTPUT VARIABLE

(71) Applicant: Robert Bosch GmbH, Stuttgart (DE)

(72) Inventors: Samuel Quenzer-Hohmuth, Reutlingen (DE); Bernhard Wicht, Gehrden (DE); Steffen Ritzmann, Reutlingen (DE); Thoralf Rosahl, Eningen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 9 days.

(21) Appl. No.: 17/621,799

(22) PCT Filed: Aug. 20, 2020

(86) PCT No.: PCT/EP2020/073330
§ 371 (c)(1),
(2) Date: Dec. 22, 2021

(87) PCT Pub. No.: WO2021/037666
PCT Pub. Date: Mar. 4, 2021

(65) Prior Publication Data
US 2022/0263518 A1 Aug. 18, 2022

(30) Foreign Application Priority Data

Aug. 23, 2019 (DE) .................... 10 2019 212 639.1

(51) Int. Cl.
*H03M 1/00* (2006.01)
*H03M 1/18* (2006.01)
(Continued)

(52) U.S. Cl.
CPC ......... *H03M 1/181* (2013.01); *H02M 1/0025* (2021.05); *H02M 3/157* (2013.01); *H03M 1/1245* (2013.01); *H03M 1/66* (2013.01)

(58) Field of Classification Search
CPC ...... H03M 1/181; H03M 1/1245; H03M 1/66; H03M 1/1295; H02M 1/0025; H02M 3/157; H02M 1/0012; H02M 3/04
(Continued)

(56) References Cited

U.S. PATENT DOCUMENTS 6,462,683 B2 * 10/2002 Draxelmayr ........... H03K 5/153
341/120
8,076,977 B2 * 12/2011 Menkhoff ............... H03L 7/085
375/376

(Continued)

FOREIGN PATENT DOCUMENTS

DE          10223771 A1    12/2003

OTHER PUBLICATIONS

International Search Report for PCT/EP2020/073330, dated Nov. 25, 2020.

*Primary Examiner* — Jean B Jeanglaude
(74) *Attorney, Agent, or Firm* — NORTON ROSE FULBRIGHT US LLP; Gerard Messina

(57) ABSTRACT

A digital closed loop control system. An output signal is detected with the aid of an analog-to-digital converter. A correction value is subtracted from the output signal prior to the analog-to-digital conversion and this correction value is added up again after the analog-to-digital conversion. The correction value in this case may be dynamically adapted. In this way, the analog-to-digital converter may be operated in a narrow conversion range.

7 Claims, 2 Drawing Sheets

(51) Int. Cl.
*H02M 1/00* (2006.01)
*H02M 3/157* (2006.01)
*H03M 1/12* (2006.01)
*H03M 1/66* (2006.01)

(58) Field of Classification Search
USPC .......................................................... 341/126
See application file for complete search history.

(56) References Cited

U.S. PATENT DOCUMENTS

| | | | |
|---|---|---|---|
| 8,922,253 B2* | 12/2014 | Rey | H03L 7/087 |
| | | | 327/108 |
| 9,048,846 B2* | 6/2015 | Menkhoff | H03L 7/0991 |
| 2006/0023476 A1 | 2/2006 | Fosler | |
| 2008/0042632 A1 | 2/2008 | Chapuis et al. | |
| 2010/0052796 A1* | 3/2010 | Menkhoff | H03L 7/0991 |
| | | | 331/17 |
| 2012/0119931 A1* | 5/2012 | Menkhoff | H03L 7/0991 |
| | | | 341/152 |
| 2012/0146828 A1* | 6/2012 | Narathong | H03M 1/664 |
| | | | 331/34 |
| 2014/0347109 A1* | 11/2014 | Rey | H03L 7/0802 |
| | | | 327/159 |
| 2017/0179833 A1* | 6/2017 | Adragna | H02M 3/335 |

* cited by examiner

CONTROL DEVICE, SWITCHING CONVERTER AND METHOD FOR CONTROLLING AN OUTPUT VARIABLE

FIELD

The present invention relates to a control device, in particular, to a control device for a switching converter as well as to a method for controlling an output variable.

BACKGROUND INFORMATION

A switching converter is able to provide a defined output voltage, in particular, a defined DC voltage at an output terminal. For controlling such switching converters, the output voltage at the switching converter must be measured and fed to a controlled system. In a digital closed loop, an analog-to-digital converter is used in this case for measuring the output voltage. For good dynamics and preferably minimal deviations, the output voltage should preferably be measured using a highly-accurate analog-to-digital converter with a short conversion time.

German Patent Application No. DE 102 23 771 A1 describes a switching converter including a digital input as well as a method for converting an input voltage into an output voltage. The switching converter includes an analog-to-digital converter including an input, to which a signal dependent on the output voltage is fed. The output signal of the analog-to-digital converter is further fed to a digital filter.

SUMMARY

The present invention provides a control device, a switching converter and a method for controlling an output variable. Further specific embodiments are disclosed herein.

Accordingly provided is, in accordance with an example embodiment of the present invention:

a control device including a first processing unit, a second processing unit, a summing unit, a compensation unit and a control unit. The first processing unit is designed to output an analog reference signal, which corresponds to a difference between a digital setpoint value and a digital correction value. The second processing unit is designed to form a difference between the analog reference signal and an analog output signal of the control device. The processing unit is further designed to convert the difference into a first digital control signal. The summing device is designed to form a sum from the first digital control signal and from a correction value, and to output this sum as a second digital control signal. The compensation unit is designed to adapt the correction value as a function of the first digital control signal. The control unit is designed to adjust an analog output signal using the second digital control signal.

Further provided is, in accordance with an example embodiment of the present invention:

a switching converter for providing an output voltage. The switching converter includes a control device according to the present invention.

Finally provided is, in accordance with an example embodiment of the present invention:

a method for controlling an output variable. The method includes a step of forming a first difference between a digital setpoint value and a digital correction value and for outputting an analog reference value that corresponds to the first difference. The method further includes a step of forming a second difference between the reference value and an analog output signal and for outputting a first digital control signal that corresponds to the second difference. The method further includes a step of forming a second control signal from a sum of the first digital control signal and the digital correction value. The method further includes a step of adjusting the analog output signal using the second digital control signal. The method further includes a step of adapting the digital correction value as a function of the first digital control signal.

The present invention is based on the finding that to control an output signal using a digital closed loop, the output variable must be detected and converted into a digital signal with the aid of an analog-to-digital converter. Very high demands are placed for this purpose on the accuracy and the conversion time of the analog-to-digital converter depending on the application. Highly accurate analog-to-digital converters having a very short conversion time require complex and cost-intensive converter architectures.

In accordance with an example embodiment of the present invention, this finding is into account and provides a digital control for an output variable, which places lower demands on the conversion range of an analog-to-digital converter of the control device. A dynamically adaptable correction value is provided for this purpose. This correction value may be used for the purpose of reducing an offset in the setpoint value and the output variable. Thus, a signal including a corresponding reduced offset may be fed to the analog-to-digital converter of the digital control. This allows for the use of highly precise and rapid analog-to-digital converters that include a simplified architecture and thus lower costs.

After the analog-to digital conversion, a value may be added to the digital output value of the analog-to-digital converter, which corresponds to the reduced offset. In this way, a value may be used for the further control, which corresponds to the actual value of the output signal of the controlled system, even though the analog-to-digital conversion is required to be carried out only in a very narrow conversion range.

According to one specific embodiment of the present invention, the compensation unit is designed to adapt the digital correction value if the absolute value of the first control signal exceeds a predefined threshold value. In this way, a dynamic adaptation of the correction value may take place. In this way, it may be ensured, in particular, that the value present at the analog-to-digital converter of the second processing unit is consistently within the limited conversion range of the analog-to-digital converter.

According to one specific embodiment of the present invention, the compensation unit may be designed to increase the correction value if the first control signal exceeds a predefined first threshold value. The compensation unit may further be designed to lower the correction value if the control signal falls below a predefined second threshold value. The first threshold value and the second threshold value in this case may be identical or also different depending on the application.

For example, the correction value may be adapted by the compensation unit when the first control signal is outside a defined window area. This window area may, for example, be between 25% and 75% of the conversion range of the analog-to-digital converter. Arbitrary other window areas are, of course, also possible.

According to one specific embodiment of the present invention, the first processing unit includes a subtraction unit and a digital-to-analog converter. The first subtraction unit is designed to form a difference between the setpoint value and the correction value. The digital-to-analog converter is designed to output an analog signal as a first control signal, the signal output as first control signal corresponding to the difference between the setpoint value and the correction value. In other words, the digital-to-analog converter carries out a digital-to-analog conversion of the difference signal from the first subtraction unit.

According to one specific embodiment of the present invention, the second processing unit includes a second subtraction unit and an analog-to-digital converter. The second subtraction unit is designed to form a difference between the reference value and the output signal. The analog-to-digital converter is designed to output a digital signal as a second control signal, the digital signal output as a second control signal corresponding to the difference between the reference value and the output signal. Thus, the analog-to-digital converter carries out an analog-to-digital conversion of the difference signal from the second subtraction unit. Due to the subtraction, the difference signal in this case is within a small value range. The analog-to-digital converter is therefore required to have only a small conversion range.

The above embodiments and refinements may, if appropriate, be arbitrarily combined with one another. Further embodiments, refinements and implementations of the present invention also include combinations of features of the present invention described above or below with respect to exemplary embodiments not explicitly mentioned. In this case, those skilled in the art will also add individual aspects as improvements on or additions to the respective basic forms of the present invention, in view of the disclosure herein.

BRIEF DESCRIPTION OF THE DRAWINGS

Further features and advantages of the present invention are explained below with reference to the figures.

DETAILED DESCRIPTION OF EXAMPLE EMBODIMENTS

Figure 1:
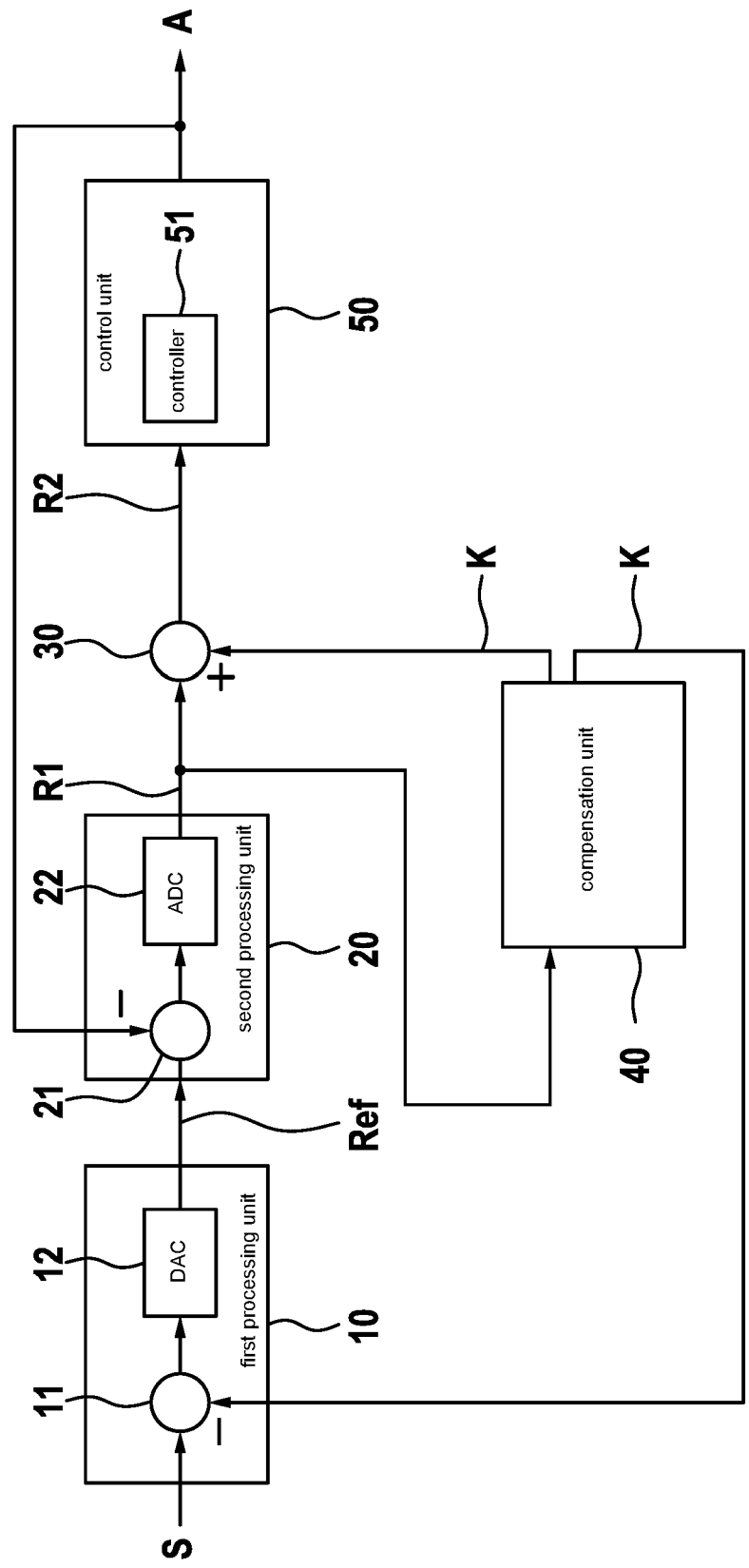
FIG. 1 schematically shows a representation of a block diagram of a control device according to one specific embodiment of the present invention.

FIG. 1 schematically shows a representation of a block diagram as the basis for a control device 1 according to one specific embodiment. Control device 1 may, for example, be the control device for a switching converter. Such a switching converter may, for example, provide a defined output voltage. For example, the switching converter may generate a defined output DC voltage from an input DC voltage. The value of the output voltage of such a switching converter may be predefined at the input of control device 1 by a setpoint value S.

To control output signal A, a control variable is provided at a controller 51 of control unit 50. Output signal A is able, for example, to adjust an output voltage using this control variable.

In order in the case of fluctuations in output signal A to control output signal A according to setpoint value S, output signal A must be measured. Output signal A must, in particular, be compared with a setpoint value S in order to subsequently carry out a corresponding control. For a digital closed loop control system, therefore, the variable of output signal A must be converted into a digital variable. This may take place using an analog-to-digital converter.

The design of control device 1 described herein makes it possible in this case to measure output signal A in digital form with the aid of an analog-to-digital converter with a relatively small conversion range or with a relatively low resolution of the conversion range. In other words, the analog-to-digital converter used here operates in a relatively small value range, i.e., the digital values are output with a resolution of only a few bits, for example, 8 bit or 6 bit. However, analog-to-digital converters having a resolution differing therefrom, for example, 16 bit, 32 bit or 64 bit or similar are also possible.

For this purpose, a (positive or negative) offset is subtracted from an input signal at an analog-to-digital converter. In this way, preferably only an analog signal is consistently present at the analog-to-digital converter in a limited value range. The value that is subtracted prior to the analog-to-digital conversion may in this case be dynamically adapted during the operation. This value may, in particular, be continuously adapted in predefined stages. This principle is explained in greater detail below with reference to FIG. 1.

A setpoint value S is provided at the input of control device 1. This setpoint value S defines the height of output signal A of control device 1. Setpoint value S may be provided in digital form. For this purpose, an arbitrary digital signal is possible.

Setpoint value S is provided at a first processing unit 10. A correction value K is further provided at this first processing unit 10. With the aid of a first subtraction unit 11, correction value K is subtracted from setpoint value S in first processing unit 10. This difference between setpoint value S and correction value K is fed to a digital-to-analog converter 12. Digital-to-analog converter 12 generates an analog reference voltage Ref, which corresponds to the formed difference. This reference voltage Ref is subsequently provided to second processing unit 20.

Second processing unit 20 includes a second subtraction unit 21, which forms a difference between the reference voltage of first processing unit 10 and output signal A. Since correction value K has been subtracted from setpoint value S in first processing unit 10, the difference output by second subtraction unit 21 does not correspond to the full deviation between output signal A and setpoint value S, but to a value reduced by correction value K. Thus, an analog-to-digital converter 22 in second processing unit 20 does not have to process the full deviation between output signal A and setpoint value S, but merely a value reduced by correction value K. Analog-to-digital converter 22 of second processing unit 20 may therefore have a lower conversion range. Analog-to-digital converter 22 of second processing unit 20 thereupon outputs a first control signal R1.

Since first control signal R1 includes a deviation between setpoint S and output signal A reduced by correction value K, first control signal R1 is fed to a summing unit 30, which adds correction value K to first control signal R1 and outputs this sum as second control signal R2. Thus, second control signal R2 represents the complete difference between setpoint value S and output signal A. This second control signal R2 may be subsequently fed to a control unit 50 including a controller 51 in order to control output signal A accordingly. Output signal A may, in particular, be controlled in accordance with the deviation between setpoint value S and actual output signal A according to second control signal R2.

In order, even in the case of possible fluctuations in output signal A, to consistently provide only a small maximum value at analog-to-digital converter 22 of second processing unit 20, correction value K may be adapted with the aid of compensation unit 40. For this purpose, compensation unit 40 may receive first control variable R1. This first control variable R1 corresponds to the instantaneous digital value of the voltage present at analog-to-digital converter 22. If compensation unit 40 recognizes from first control variable R1 that the value of the voltage at the input of analog-to-digital converter 22 moves in the direction of the conversion range of analog-to-digital converter 22, the value at the input of analog-to-digital converter 22 may be correspondingly adapted by a corresponding adaptation of correction variable K. If first control variable R1 increases, for example, then the reference signal may be adapted by first processing unit 10 by correspondingly adapting correction variable K. The adaptation of correction value K may, in particular, take place in predefined steps. For this purpose, predefined threshold values may be defined, for example. If first control variable R1 falls below or exceeds these threshold values, an adaptation of correction value K by compensation unit 40 then takes place.

The threshold values may be adjusted, in particular, in accordance with the conversion range of analog-to-digital converter 22. As long as first control variable R1 moves within a predefined window around the middle of the conversion range of analog-to-digital converter 22, the instantaneous correction value K may then be maintained. If the value of first control signal R1 is outside the predefined window, then correction value K is increased or lowered accordingly. For example, this window may encompass 50% of the conversion range of the analog-to-digital converter.

Figure 2:
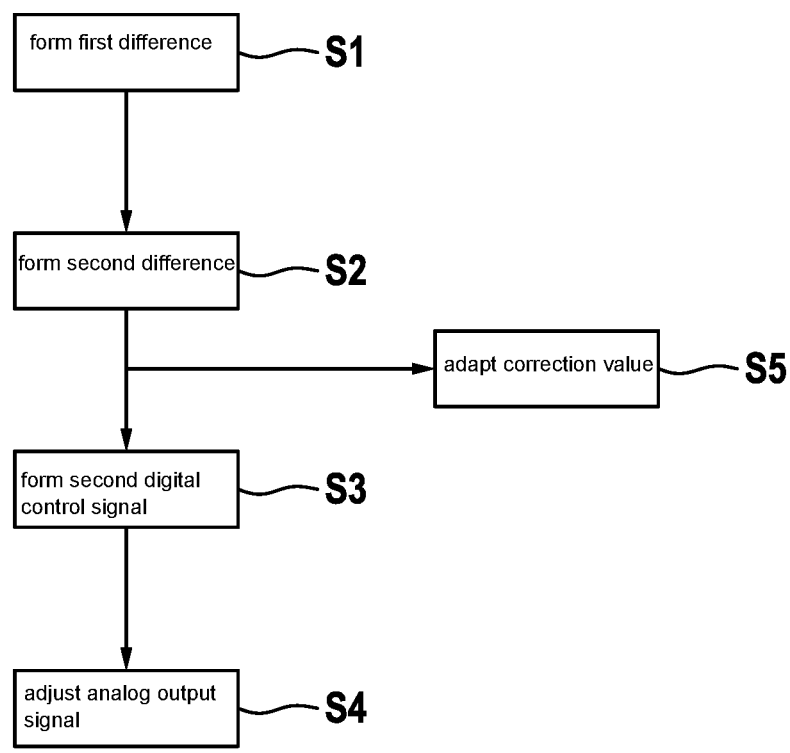
FIG. 2 shows a flowchart as the basis for a method for controlling an output signal according to one specific embodiment of the present invention.

FIG. 2 schematically shows a representation of a flowchart as the basis for a method for controlling an output signal according to one specific embodiment.

In step S1, a first difference between a digital setpoint value S and a digital correction value K is formed and an analog reference value Ref is subsequently output, which corresponds to the first difference.

In step S2, a second difference between reference value Ref and an analog output signal A is formed and a first digital control signal R1 is subsequently output, which corresponds to the second difference.

In step S3, a second digital control signal R2 is formed from the sum of first control signal R1 and correction value K. In step S4, the adjustment of analog output signal A takes place using second digital control signal R2.

Correction value K may be adapted as needed in step S5 as a function of first control signal R1.

In summary, the present invention relates to a digital closed loop control system. An output signal is detected with the aid of an analog-to-digital converter. In this case, a correction value is subtracted from the output signal prior to the analog-to-digital conversion and this correction value is added up again after the analog-to-digital conversion. The correction value in this case may be dynamically adapted. In this way, the analog-to-digital converter may be operated in a narrow conversion range. This allows the use of cost-effective and yet highly precise analog-to-digital converters.

What is claimed is:

1. A control device, comprising:
a first processing unit configured to output an analog reference signal, which corresponds to a difference between a setpoint value and a digital correction value;
a second processing unit configured to form a difference between the analog reference signal and an analog output signal and to convert the difference between the analog reference signal and the analog output signal into a first digital control signal;
a summing unit configured to form a sum of the first digital control signal and the digital correction value and to output the sum as a second digital control signal;
a compensation unit configured to adapt the digital correction value as a function of the first digital control signal; and
a control unit configured to adjust the analog output signal using the second digital control signal,
wherein the digital correction value is configured to be adapted by the compensation unit when the first control signal is outside a defined window area.

2. The control device as recited in claim 1, wherein the compensation unit is configured to adapt the digital correction value when the absolute value of the first digital control signal exceeds a predefined threshold value.

3. The control device as recited in claim 1, wherein the compensation unit is configured to increase the digital correction value when the first digital control signal falls below a predefined first threshold value, and lowers the digital correction value when the first control signal exceeds a predefined second threshold value.

4. The control device as recited in claim 1, wherein the first processing unit includes a first subtraction unit and a digital-to-analog converter, the first subtraction unit being configured to form the difference between the setpoint value and the digital correction value, and the digital-to-analog converter being configured to output an analog signal as the analog reference signal which corresponds to the difference between the setpoint value and the correction value.

5. The control device as recited in claim 1, wherein the second processing unit includes a second subtraction unit and an analog-to-digital converter, the second subtraction unit being configured to form the difference between the reference signal and the output signal, and the analog-to-digital converter being configured to output a digital signal as the first digital control signal, which corresponds to the difference between the reference value and the analog output signal.

6. A switching converter for providing an output voltage, switching converter comprising:
a control device, including:
a first processing unit configured to output an analog reference signal, which corresponds to a difference between a setpoint value and a digital correction value,
a second processing unit configured to form a difference between the analog reference signal and an analog output signal and to convert the difference between the analog reference signal and the analog output signal into a first digital control signal,
a summing unit configured to form a sum of the first digital control signal and the correction value and to output the sum as a second digital control signal,
a compensation unit configured to adapt the correction value as a function of the first digital control signal, and
a control unit configured to adjust the analog output signal using the second digital control signal,
wherein the digital correction value is configured to be adapted by the compensation unit when the first control signal is outside a defined window area.

7. A method for controlling an output signal, comprising the following steps:
forming a first difference between a digital setpoint value and a digital correction value and outputting an analog reference value, which corresponds to the first difference;

forming a second difference between the analog reference value and the output signal and outputting a first digital control signal which corresponds to the second difference;

forming a second digital control signal from a sum of the first digital control signal and the digital correction value;

adjusting the output signal using the second digital control signal; and adapting the digital correction value as a function of the first digital control signal, wherein the digital correction value is configured to be adapted by the compensation unit when the first control signal is outside a defined window area.

* * * * *